US010585409B2

(12) United States Patent
Mercep et al.

(10) Patent No.: US 10,585,409 B2
(45) Date of Patent: Mar. 10, 2020

(54) VEHICLE LOCALIZATION WITH MAP-MATCHED SENSOR MEASUREMENTS

(71) Applicant: Mentor Graphics Corporation, Wilsonville, OR (US)

(72) Inventors: Ljubo Mercep, München (DE); Matthias Pollach, München (DE)

(73) Assignee: Mentor Graphics Corporation, Wilsonville, OR (US)

(*) Notice: Subject to any disclaimer, the term of this patent is extended or adjusted under 35 U.S.C. 154(b) by 0 days.

(21) Appl. No.: 15/419,922

(22) Filed: Jan. 30, 2017

(65) Prior Publication Data
US 2018/0066954 A1 Mar. 8, 2018

Related U.S. Application Data (60) Provisional application No. 62/385,156, filed on Sep. 8, 2016, provisional application No. 62/385,149, filed on Sep. 8, 2016.

(51) Int. Cl.
*G01C 21/36* (2006.01)
*G01C 21/34* (2006.01)
(Continued)

(52) U.S. Cl.
CPC ............ *G05B 17/02* (2013.01); *G01C 21/28* (2013.01); *G01C 21/3407* (2013.01);
(Continued)

(58) Field of Classification Search
CPC .... G05D 1/021; G05D 1/0231; G05D 1/0242; G05D 1/0244; G05D 1/0246;
(Continued)

(56) References Cited

U.S. PATENT DOCUMENTS 4,796,191 A * 1/1989 Honey .................. G01C 21/14
701/445
5,363,305 A * 11/1994 Cox ...................... G01C 21/00
700/253
(Continued)

FOREIGN PATENT DOCUMENTS

| CN | 101876750 A | 11/2010 |
| EP | 2107503 A1 | 10/2009 |
| WO | 2009070069 A1 | 6/2009 |

OTHER PUBLICATIONS

Danescu et al., Stereovision-Based Sensor for Intersection Assistance, 2009, Advanced Microsystems for Automotive Applications, Springer (Year: 2009).*
(Continued)

*Primary Examiner* — Thomas G Black
*Assistant Examiner* — Sara J Lewandroski
(74) *Attorney, Agent, or Firm* — Mentor Graphics Corporation (57) ABSTRACT

This application discloses a computing system to implement vehicle localization in an assisted or automated driving system. The computing system can receive an environmental model populated with measurement data captured by sensors mounted in a vehicle. The computing system can detect a location of the vehicle relative to the map data based on a correlation between the measurement data and the map data. The computing system can detect landmarks in the map data and switch to sparsely-populated map data from higher-definition map data for subsequent location detections. When the computing system does not detect a vehicle location, the computing system can track movement of the vehicle based on subsequent measurement data in the environmental model. After reacquiring a vehicle location, the computing can realign the tracked movement of the vehicle
(Continued)

and measured data to the map data or modify the map data to include the tracked data.

17 Claims, 7 Drawing Sheets

(51) Int. Cl.
| | |
|---|---|
| G05B 17/02 | (2006.01) |
| G05D 1/00 | (2006.01) |
| G05D 1/02 | (2020.01) |
| G06F 16/29 | (2019.01) |
| G06F 17/50 | (2006.01) |
| G01C 21/28 | (2006.01) |
| G01S 13/931 | (2020.01) |
| G01S 15/931 | (2020.01) |
| G01S 17/93 | (2020.01) |
| G08G 1/16 | (2006.01) |

(52) U.S. Cl.
CPC ........ *G01C 21/3667* (2013.01); *G01S 13/931* (2013.01); *G01S 15/931* (2013.01); *G01S 17/936* (2013.01); *G05D 1/0088* (2013.01); *G05D 1/021* (2013.01); *G05D 1/024* (2013.01); *G05D 1/0246* (2013.01); *G05D 1/0255* (2013.01); *G05D 1/0257* (2013.01); *G05D 1/0259* (2013.01); *G05D 1/0268* (2013.01); *G05D 1/0276* (2013.01); *G06F 16/29* (2019.01); *G06F 17/5009* (2013.01); *G08G 1/161* (2013.01); *G08G 1/164* (2013.01); *G05D 1/0278* (2013.01)

(58) Field of Classification Search
CPC .. G05D 1/0248; G05D 1/0251; G05D 1/0253; G05D 1/0268; G05D 1/027; G05D 1/0272; G05D 1/0274; G05D 1/0276; G05D 1/0278; G05D 1/028; G05D 1/0285; G08G 1/16; G08G 1/161; G08G 1/162; G08G 1/163; G08G 1/165; G08G 1/167; G01C 21/00; G01C 21/005; G01C 10/12; G01C 10/14; G01C 10/165; G01C 10/26; G01C 10/30; G01C 10/32
See application file for complete search history.

(56) References Cited

U.S. PATENT DOCUMENTS

| | | | |
|---|---|---|---|
| 5,508,931 A * | 4/1996 | Snider .................... G01C 21/30 701/446 |
| 6,453,223 B1 * | 9/2002 | Kelly .................... G05D 1/0246 318/587 |
| 7,164,472 B2 | 1/2007 | Dorrance et al. |
| 8,805,648 B2 | 8/2014 | Painsky |
| 8,912,978 B2 | 12/2014 | Szczerba |
| 9,043,072 B1 | 5/2015 | Tisdale et al. |
| 9,097,800 B1 | 8/2015 | Zhu |
| 9,243,916 B2 | 1/2016 | Roumeliotis |
| 9,285,805 B1 | 3/2016 | Pollock |
| 9,315,192 B1 | 4/2016 | Zhu et al. |
| 9,321,461 B1 * | 4/2016 | Silver .............. B60W 30/0956 |
| 9,336,436 B1 | 5/2016 | Dowdall |
| 9,384,402 B1 | 7/2016 | Furman |
| 9,612,123 B1 | 4/2017 | Levinson |
| 9,623,905 B2 | 4/2017 | Shashua |
| 9,665,100 B2 * | 5/2017 | Shashua ................. G01C 21/32 |
| 9,690,293 B2 | 6/2017 | Shashua |
| 9,696,719 B2 | 7/2017 | Aviel |
| 9,709,986 B2 | 7/2017 | Gdalyahi |
| 9,719,801 B1 * | 8/2017 | Ferguson ............... G01C 25/00 |
| 9,760,090 B2 | 9/2017 | Shashua |
| 2005/0078304 A1 | 4/2005 | Dorrance et al. |
| 2005/0258943 A1 | 11/2005 | Mian et al. |
| 2007/0182623 A1 | 8/2007 | Zeng |
| 2008/0033645 A1 | 2/2008 | Levinson et al. |
| 2008/0243378 A1 * | 10/2008 | Zavoli .................... G01C 21/28 701/533 |
| 2009/0195371 A1 | 8/2009 | Camus |
| 2009/0228204 A1 * | 9/2009 | Zavoli .................... G01C 21/30 701/532 |
| 2009/0278673 A1 | 11/2009 | Li |
| 2009/0299633 A1 | 12/2009 | Hawes et al. |
| 2010/0217522 A1 * | 8/2010 | Ando .................... G01C 21/30 701/532 |
| 2012/0136510 A1 | 5/2012 | Min et al. |
| 2012/0310516 A1 | 12/2012 | Zeng |
| 2012/0320213 A1 | 12/2012 | Ikeda et al. |
| 2013/0091503 A1 | 4/2013 | Painsky |
| 2013/0155418 A1 | 6/2013 | Shaw et al. |
| 2013/0181860 A1 | 7/2013 | Le et al. |
| 2013/0328862 A1 | 12/2013 | Piemonte |
| 2013/0332061 A1 | 12/2013 | Dowdall et al. |
| 2014/0111645 A1 | 4/2014 | Shylanski et al. |
| 2014/0267415 A1 | 9/2014 | Tang et al. |
| 2014/0334721 A1 | 11/2014 | Cervin et al. |
| 2014/0379254 A1 * | 12/2014 | Miksa .................... G01C 21/32 701/450 |
| 2015/0049193 A1 | 2/2015 | Gupta et al. |
| 2015/0127247 A1 * | 5/2015 | Xu .......................... G01C 21/34 701/411 |
| 2015/0220086 A1 | 8/2015 | Willgert |
| 2015/0268058 A1 | 9/2015 | Samarasekera |
| 2015/0279182 A1 | 10/2015 | Kanaujia et al. |
| 2016/0109564 A1 | 4/2016 | Sieber et al. |
| 2016/0129917 A1 | 5/2016 | Gariepy et al. |
| 2016/0223643 A1 | 8/2016 | Li et al. |
| 2016/0236683 A1 * | 8/2016 | Eggert .................... G01C 21/20 |
| 2016/0341822 A1 | 11/2016 | Wang et al. |
| 2016/0357188 A1 | 12/2016 | Ansari |
| 2016/0364985 A1 | 12/2016 | Penna et al. |
| 2016/0368505 A1 | 12/2016 | Sorstedt et al. |
| 2017/0008521 A1 * | 1/2017 | Braunstein ............. G01C 21/32 |
| 2017/0010106 A1 | 1/2017 | Shashua et al. |
| 2017/0016740 A1 | 1/2017 | Cui et al. |
| 2017/0052032 A1 * | 2/2017 | Miksa .................... G01C 21/28 |
| 2017/0076455 A1 * | 3/2017 | Newman ................... G06T 7/74 |
| 2017/0080950 A1 | 3/2017 | Pink |
| 2017/0124781 A1 | 5/2017 | Douillard |
| 2017/0139411 A1 | 5/2017 | Hartung et al. |
| 2017/0248963 A1 | 8/2017 | Levinson |
| 2017/0261324 A1 | 9/2017 | Roumeliotis |
| 2017/0270361 A1 | 9/2017 | Puttagunta |
| 2017/0277716 A1 | 9/2017 | Giurgiu et al. |
| 2017/0305438 A1 | 10/2017 | Poledna et al. |
| 2017/0316333 A1 | 11/2017 | Levinson et al. |
| 2017/0329327 A1 | 11/2017 | Trigui et al. |
| 2017/0337690 A1 * | 11/2017 | Arth ........................ G06T 7/136 |
| 2017/0343356 A1 | 11/2017 | Roumeliotis |
| 2017/0372148 A1 | 12/2017 | Chen et al. |
| 2018/0003512 A1 * | 1/2018 | Lynch .................... G05D 1/0274 |
| 2018/0018527 A1 | 1/2018 | Micks et al. |
| 2018/0024565 A1 * | 1/2018 | Fridman ............ G06K 9/00791 701/26 |
| 2018/0025235 A1 | 1/2018 | Fridman |
| 2018/0032082 A1 * | 2/2018 | Shalev-Shwartz .......................... B60W 30/0953 |
| 2018/0045521 A1 * | 2/2018 | Wege .................... G01C 21/206 |
| 2018/0060675 A1 * | 3/2018 | Ji .......................... G05D 1/0246 |
| 2018/0067488 A1 | 3/2018 | Pollach et al. |
| 2018/0067489 A1 | 3/2018 | Oder et al. |
| 2018/0067490 A1 | 3/2018 | Pollach et al. |
| 2018/0067495 A1 | 3/2018 | Oder et al. |
| 2018/0067966 A1 | 3/2018 | Oder et al. |
| 2018/0068206 A1 | 3/2018 | Pollach et al. |
| 2018/0172454 A1 | 6/2018 | Ghadiok et al. |
| 2018/0202814 A1 * | 7/2018 | Kudrynski ................ G06T 7/55 |
| 2018/0202815 A1 * | 7/2018 | Asai ........................ G01C 21/30 |
| 2018/0314921 A1 | 11/2018 | Mercep et al. |
| 2018/0332232 A1 | 11/2018 | Horak |
| 2019/0086546 A1 | 3/2019 | Tsishkou et al. |

(56) References Cited

U.S. PATENT DOCUMENTS

| | | |
|---|---|---|
| 2019/0098471 A1 | 3/2019 | Rech et al. |
| 2019/0236862 A1 | 8/2019 | Mercep et al. |
| 2019/0236865 A1 | 8/2019 | Mercep et al. |

OTHER PUBLICATIONS

Nedevschi et al., "Accurate Ego-Vehicle Global Localization at Intersections through Alignment of Visual Data with Digital Map," Jun. 2013, IEEE (Year: 2013).*

Barzilay and Szolovits, "Exact inference in bayes nets—pseudocode." Mass. Init. Technology (retrieved at http://courses.csail.mit.edu/6.034s/handouts/spring12/bayesnets-bseudocode.pdf on Jun. 4, 2018), Feb. 2012.

T. M. Chan. "Optimal output-sensitive convex hull algorithms in two and three dimensions." Discrete and Computational Geometry, vol. 16, Issue No. 4, pp. 361-368, Jan. 1, 1996.

Hyunggi Cho, Young-Woo Seo, BVK Vijaya Kumar, and Ragunathan Raj Rajkumar. "A multi-sensor fusion system for moving object detection and tracking in urban driving environments." IEEE International Conference on Robotics and Automation (ICRA), pp. 1836-1843. IEEE, May 2014.

N. Dalai and B. Triggs. "Histograms of oriented gradients for human detection." IEEE Computer Society Conference on Computer Vision and Pattern Recognition (CVPR'05), vol. 1, pp. 886-893, Jun. 2005.

Martin Ester, Hans peter Kriegel, Jrg Sander, and Xiaowei Xu. "A density-based algorithm for discovering clusters in large spatial databases with noise." pp. 226-231. Proc. 2nd Int. Conf. Knowledge Discovery and Data Mining (KDD'96), American Association for Artificial Intelligence (AAAI) Press, Aug. 1996.

K. C. Fuerstenberg, K. C. J. Dietrnayer, and V. Willhoeft. "Pedestrian recognition in urban traffic using a vehicle based multilayer laserscanner." IEEE Intelligent Vehicle Symposium, vol. 1, pp. 31-35, Jun. 2002.

Daniel Gohring, Miao Wang, Michael Schnurmacher, and Tinosch Ganjineh, "Radar/lidar sensor fusion for car-following on highways." IEEE 2011 5th International Conference on Automation, Robotics and Applications (ICARA), pp. 407-412, Dec. 2011.

John A Hartigan and Manchek A Wong. "Algorithm as 136: A k-means clustering algorithm." Journal of the Royal Statistical Society. Series C (Applied Statistics), vol. 28, issue 1, pp. 100-108, Jan. 1979.

S. C. Johnson. "Hierarchical clustering schemes." Psychometrika, vol. 32, issue 3, pp. 241-254, Sep. 1967.

N. Kaempchen, M. Buehler, and K. Dietmayer. "Feature-level fusion for freeform object tracking using laserscanner and video." Intelligent Vehicles Symposium, IEEE Proceedings, pp. 453-458, Jun. 2005.

Nico Kaempchen and Klaus Dietmayer. "Data synchronization strategies for multi-sensor fusion." Intelligent Transportation Systems, Proceedings of the IEEE Conference, pp. 1-9, Oct. 2003.

Nico Kampchen, "Feature-level fusion of laser scanner and video data for advanced driver assistance systems." University of Ulm Faculty, Engineering Sciences, Computer Science, Jun. 2007.

D. Kellner, M. Barjenbruch, K. Dietmayer, J. Klappstein, and J. Dickmann. "Instantaneous lateral velocity estimation of a vehicle using doppler radar." Information Fusion, Proceedings of the 16th International Conference, pp. 877-884, Jul. 2013.

P. Kmiotek and Y. Ruichek. "Representing and tracking of dynamics objects using oriented bounding box and extended kairnan filter." 11th International IEEE Conference on Intelligent Transportation Systems, pp. 322-328, Oct. 2008.

S. Lange, F. Ulbrich, and D. Goehring. "Online vehicle detection using deep neural networks and lidar based preselected image patches." IEEE Intelligent Vehicles Symposium (IV), pp. 954-959, Jun. 2016.

H. A. Loeliger, J. Dauweis, J. Hu, S. Kori, L. Ping, and F. R. Kschischang, "The factor graph approach to model-based signal processing." Proceedings of the IEEE, vol. 95, issue 6, pp. 1295-1322, Jun. 2007.

M. Mahlisch, R. Schweiger, W. Ritter, and K. Dietmayer. "Sensorfusion using spatio-temporal aligned video and lidar for improved vehicle detection." IEEE Intelligent Vehicles Symposium, pp. 424-429, Jun. 2006.

Ljubo Mercep. "Context-Centric Design of Automotive Human-Machine Interfaces." PhD thesis, Technische Universiat Munchen. Jan. 2014.

S. Roberts. "Parametric and non-parametric unsupervised cluster analysis," Pattern Recognition. vol. 30, pp. 261-272. Apr. 1996.

J. Sankaran and N. Zoran. Tda2x, a soc optimized for advanced driver assistance systems. Speech and Signal Processing (ICASSP), IEEE international Conference on Acoustics, pp. 2204-2208, May 2014.

R. Schubert, C. Adam, M. Obst, N. Mattern, V. Leonhardt, and G. Wanielik. "Empirical evaluation of vehicular models for ego motion estimation," 2011 IEEE Intelligent Vehicles Symposium (IV), pp. 534-539, Jun. 2011.

Neil Scicluna and Christos-Savvas Bouganis. "ARC 2014: A Multidimensional FPGA-Based Parallel DBSCAN Architecture." ACM Transactions on Recorifigurabie Technology arid Systems. vol. 9, issue 1, pp. 1-12, Nov. 2015.

Qi Yue Shaobo Shi and Qin Wang, "Fpga based accelerator for parallel dbscan algorithm." Computer Modelling & New Technologies. vol. 18, issue 2, pp. 135-142, Jan. 2014.

Z. Taylor and J. Nieto. "Motion-based calibration of multimodal sensor extrinsics and timing o_set estimation." IEEE Transactions on Robotics. vol. 32, issue 5, pp. 1215-1229, Oct. 2016.

Rui Xu and D. Wunsch, II. "Survey of clustering algorithms." Trans. Neur. Netw. vol. 16, issue 3, pp. 645-678, May 2005.

Christopher M. Bishop. "Pattern Recognition and Machine Learning (Information Science and Statistics)." Springer-Verlag New York, Inc., Secaucus, NJ,USA, pp. 423-435, pp. 423-435, Aug. 2006.

Judea Pearl, "Probabilistic Reasoning in intelligent Systems: Networks of Plausible Inference." Morgan Kaufmann Publishers Inc., San Francisco, CA, USA, p. 116-123, Sep. 1988.

David L. Half and Sonya A. H. McMullen. "Mathematical techniques in multisensor data fusion." Artech House Information Warfare Library. pp. 1-4, Feb. 2004.

Fredrik Sandblom et al., "Sensor Data Fusion for Multiple Configurations", IEEE Intelligent Vehicles Symposium (IV), Jun. 8-11, 2014, Dearborn, Michigan, USA, pp. 1325-1331.

Floudas et al.,"Multi-Sensor Coordination and Fusion for Automotive Safety Applications"; in International Conference on Information Fusion; Fusion 2006 of Elec. and Elec. Eng. Domputer Society US, IEE, Piscataway, NJ, USA, Jul. 1, 2006, pp. 1-8.

C. Coue et al.,"Using Bayesian Programming for Multi-Sensor Multi-Target Tracking in Automotive Applications." Proceedings/ 2003 IEEE International Conference on Robotics and Automation, Sep. 14-19, 2003, The Grand Hotel, Taipei, Taiwan, IEEE Service Center Piscataway, NJ, vol. 2, pp. 2104-2109.

Weiss K et al,"Target modeling and dynamic classification for adaptive sensor data fusion"; Proc. IEEE Intelligent Vehicle Symposium 2003, Jun. 9, 2003 (Jun. 9, 2003), pp. 132-137, XP010645863, ISBN: 978-0-7803-7848-3.

Nedevschi et al; "Accurate Ego-Vehicle Global Localization at Intersections Through Alignment of Visual Data With Digital Map"; Jun. 2013, IEEE; pp. 673-687.

Danescu et al; "Stereovision-Based Sensor for Intersection Assistance"; 2009; Advanced Microsystems for Automotive Applications; Springer; pp. 129-163.

* cited by examiner

VEHICLE LOCALIZATION WITH MAP-MATCHED SENSOR MEASUREMENTS

RELATED APPLICATION

This patent application claims priority to U.S. Provisional Patent Application No. 62/385,149, filed Sep. 8, 2016, and claims priority to U.S. Provisional Patent Application No. 62/385,156, filed Sep. 8, 2016, which are incorporated by reference herein.

TECHNICAL FIELD

This application is generally related to automated driving and assistance systems and, more specifically, to event-driven region of interest management for automated driving and assistance systems.

BACKGROUND

Many modern vehicles include built-in advanced driver assistance systems (ADAS) to provide automated safety and/or assisted driving functionality. For example, these advanced driver assistance systems can have applications to implement adaptive cruise control, automatic parking, automated braking, blind spot monitoring, collision avoidance, driver drowsiness detection, lane departure warning, or the like. The next generation of vehicles can include autonomous driving (AD) systems to control and navigate the vehicles independent of human interaction.

These vehicles typically include multiple sensors, such as one or more cameras, a Light Detection and Ranging (Lidar) sensor, a Radio Detection and Ranging (Radar) system, or the like, to measure different portions of the environment around the vehicles. Each sensor processes their own measurements captured over time to detect an object within their field of view, and then provide a list of detected objects to an application in the advanced driver assistance systems or the autonomous driving systems to which the sensor is dedicated. In some instances, the sensors can also provide a confidence level corresponding to their detection of objects on the list based on their captured measurements.

The applications in the advanced driver assistance systems or the autonomous driving systems can utilize the list of objects received from their corresponding sensors and, in some cases, the associated confidence levels of their detection, to implement automated safety and/or driving functionality. For example, when a radar sensor in the front of a vehicle provides the advanced driver assistance system in the vehicle a list having an object in a current path of the vehicle, the application corresponding to front-end collision in the advanced driver assistance system can provide a warning to the driver of the vehicle or control vehicle in order to avoid a collision with the object.

Because each application has dedicated sensors, the application can receive a list of objects from the dedicated sensors that provides the application a fixed field of view in around a portion of the vehicle. When multiple sensors for an application have at least partially overlapping fields of view, the application can integrate object lists from its multiple dedicated sensors for the fixed field of view around the portion of the vehicle for the application. Since the vehicle moves, however, having a narrow field of view provided from the sensors can leave the application blind to potential objects. Conversely, widening the field of view can increase cost, for example, due to additional sensors, and add data processing latency.

SUMMARY

This application discloses a computing system to implement localization in an assisted or automated driving system of a vehicle. The computing system can receive at least a portion of an environmental model populated with measurement data captured by sensors mounted in a vehicle. The measurement data can be temporally aligned and spatially aligned in the environmental model. The computing system can compare the measurement data in the environmental model to map data, and when the comparison identifies a correlation between the measurement data in the environmental model and the map data, detect a location of the vehicle relative to the map data.

In some embodiments, the computing system can detect landmarks in the map data and switch to sparsely-populated map data from higher-definition map data for subsequent comparisons. When the comparison does not identify the correlation between the measurement data and the map data, the computing system can track movement of the vehicle based on subsequent measurement data in the environmental model. When the computing system reacquires a vehicle location, the computing can realign the tracked movement of the vehicle and measured data to the map data or modify the map data to include the subsequent measured data utilized to track the movement of the vehicle. Embodiments will be described below in greater detail.

DETAILED DESCRIPTION

Sensor Fusion for Autonomous Driving

Figure 1:
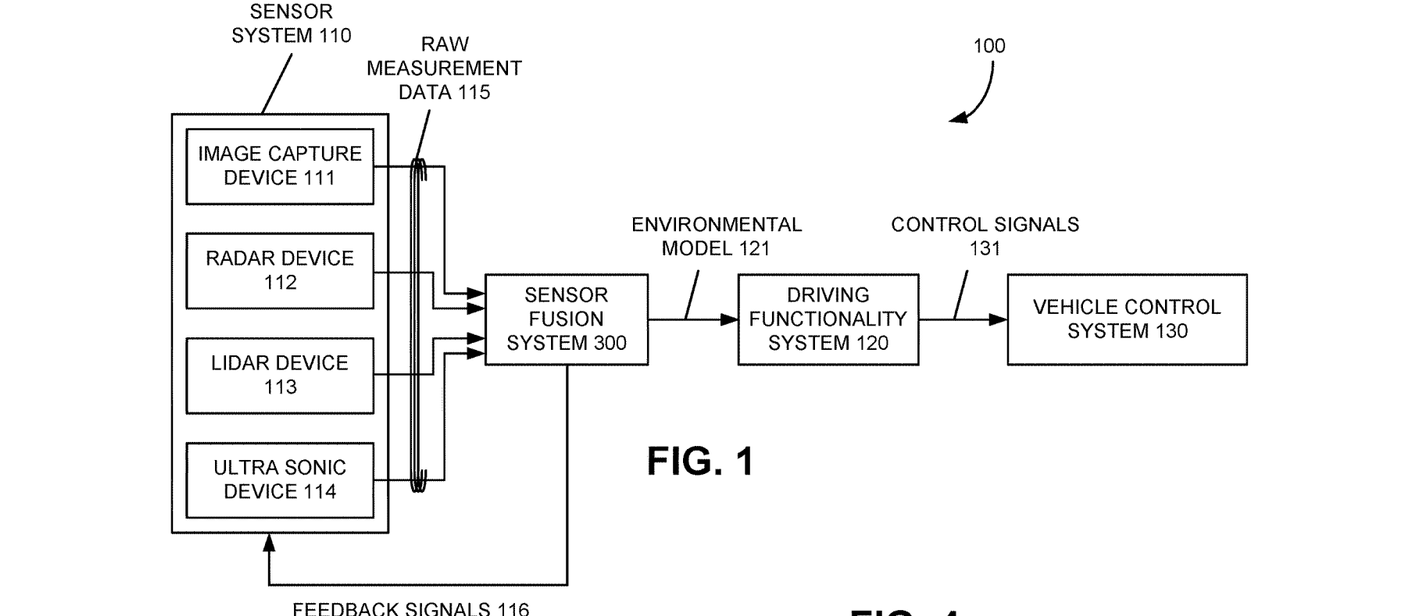
FIG. 1 illustrates an example autonomous driving system according to various embodiments of the invention.

FIG. 1 illustrates an example autonomous driving system 100 according to various embodiments. Referring to FIG. 1, the autonomous driving system 100, when installed in a vehicle, can sense an environment surrounding the vehicle and control operation of the vehicle based, at least in part, on the sensed environment.

The autonomous driving system 100 can include a sensor system 110 having multiple sensors, each of which can measure different portions of the environment surrounding the vehicle and output the measurements as raw measurement data 115. The raw measurement data 115 can include characteristics of light, electromagnetic waves, or sound captured by the sensors, such as an intensity or a frequency of the light, electromagnetic waves, or the sound, an angle of reception by the sensors, a time delay between a transmission and the corresponding reception of the light, electromagnetic waves, or the sound, a time of capture of the light, electromagnetic waves, or sound, or the like.

The sensor system 110 can include multiple different types of sensors, such as an image capture device 111, a Radio Detection and Ranging (Radar) device 112, a Light Detection and Ranging (Lidar) device 113, an ultra-sonic device 114, one or more microphones, infrared or night-vision cameras, time-of-flight cameras, cameras capable of detecting and transmitting differences in pixel intensity, or the like. The image capture device 111, such as one or more cameras, can capture at least one image of at least a portion of the environment surrounding the vehicle. The image capture device 111 can output the captured image(s) as raw measurement data 115, which, in some embodiments, can be unprocessed and/or uncompressed pixel data corresponding to the captured image(s).

The radar device 112 can emit radio signals into the environment surrounding the vehicle. Since the emitted radio signals may reflect off of objects in the environment, the radar device 112 can detect the reflected radio signals incoming from the environment. The radar device 112 can measure the incoming radio signals by, for example, measuring a signal strength of the radio signals, a reception angle, a frequency, or the like. The radar device 112 also can measure a time delay between an emission of a radio signal and a measurement of the incoming radio signals from the environment that corresponds to emitted radio signals reflected off of objects in the environment. The radar device 112 can output the measurements of the incoming radio signals as the raw measurement data 115.

The lidar device 113 can transmit light, such as from a laser or other optical transmission device, into the environment surrounding the vehicle. The transmitted light, in some embodiments, can be pulses of ultraviolet light, visible light, near infrared light, or the like. Since the transmitted light can reflect off of objects in the environment, the lidar device 113 can include a photo detector to measure light incoming from the environment. The lidar device 113 can measure the incoming light by, for example, measuring an intensity of the light, a wavelength, or the like. The lidar device 113 also can measure a time delay between a transmission of a light pulse and a measurement of the light incoming from the environment that corresponds to the transmitted light having reflected off of objects in the environment. The lidar device 113 can output the measurements of the incoming light and the time delay as the raw measurement data 115.

The ultra-sonic device 114 can emit acoustic pulses, for example, generated by transducers or the like, into the environment surrounding the vehicle. The ultra-sonic device 114 can detect ultra-sonic sound incoming from the environment, such as, for example, the emitted acoustic pulses having been reflected off of objects in the environment. The ultra-sonic device 114 also can measure a time delay between emission of the acoustic pulses and reception of the ultra-sonic sound from the environment that corresponds to the emitted acoustic pulses having reflected off of objects in the environment. The ultra-sonic device 114 can output the measurements of the incoming ultra-sonic sound and the time delay as the raw measurement data 115.

Figure 2A:
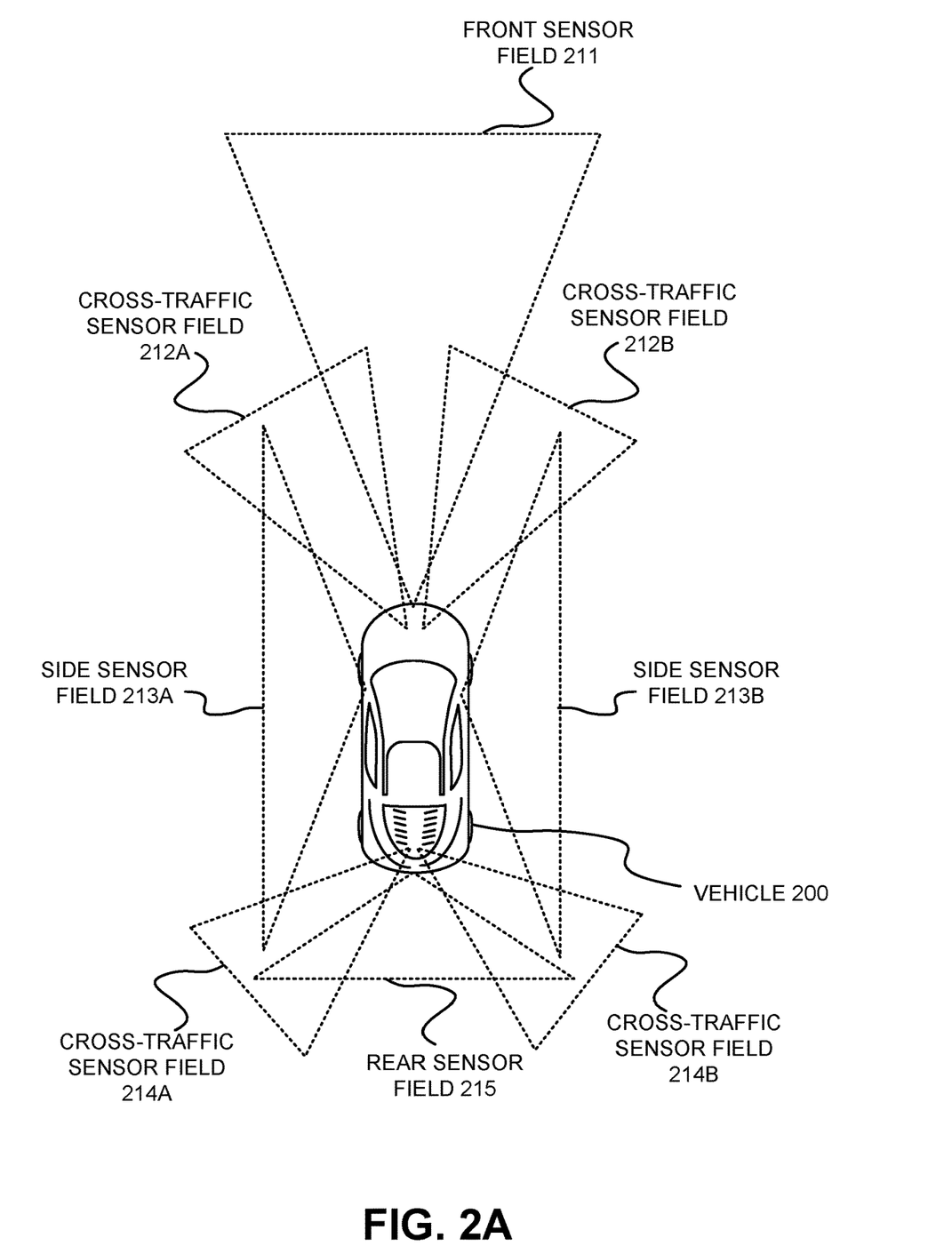
FIG. 2A illustrates an example measurement coordinate fields for a sensor system deployed in a vehicle according to various embodiments of the invention.

The different sensors in the sensor system 110 can be mounted in the vehicle to capture measurements for different portions of the environment surrounding the vehicle. FIG. 2A illustrates an example measurement coordinate fields for a sensor system deployed in a vehicle 200 according to various embodiments. Referring to FIG. 2A, the vehicle 200 can include multiple different sensors capable of detecting incoming signals, such as light signals, electromagnetic signals, and sound signals. Each of these different sensors can have a different field of view into an environment around the vehicle 200. These fields of view can allow the sensors to measure light and/or sound in different measurement coordinate fields.

The vehicle in this example includes several different measurement coordinate fields, including a front sensor field 211, multiple cross-traffic sensor fields 212A, 212B, 214A, and 214B, a pair of side sensor fields 213A and 213B, and a rear sensor field 215. Each of the measurement coordinate fields can be sensor-centric, meaning that the measurement coordinate fields can describe a coordinate region relative to a location of its corresponding sensor.

Referring back to FIG. 1, the autonomous driving system 100 can include a sensor fusion system 300 to receive the raw measurement data 115 from the sensor system 110 and populate an environmental model 121 associated with the vehicle with the raw measurement data 115. In some embodiments, the environmental model 121 can have an environmental coordinate field corresponding to a physical envelope surrounding the vehicle, and the sensor fusion system 300 can populate the environmental model 121 with the raw measurement data 115 based on the environmental coordinate field. In some embodiments, the environmental coordinate field can be a non-vehicle centric coordinate field, for example, a world coordinate system, a path-centric coordinate field, or the like.

Figure 2B:
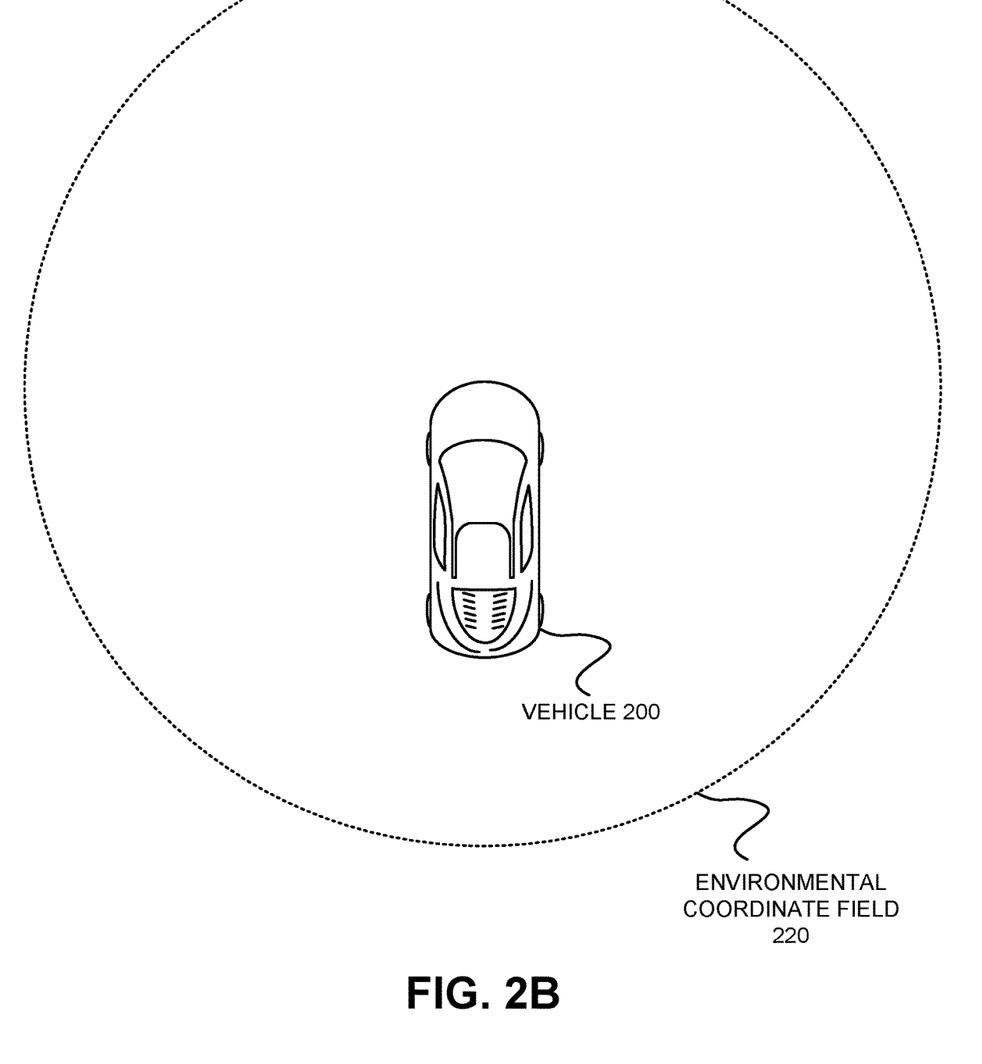
FIG. 2B illustrates an example environmental coordinate field associated with an environmental model for a vehicle according to various embodiments of the invention.

FIG. 2B illustrates an example environmental coordinate field 220 associated with an environmental model for the vehicle 200 according to various embodiments. Referring to FIG. 2B, an environment surrounding the vehicle 200 can correspond to the environmental coordinate field 220 for the environmental model. The environmental coordinate field 220 can be vehicle-centric and provide a 360 degree area around the vehicle 200. The environmental model can be populated and annotated with information detected by the sensor fusion system 300 or inputted from external sources. Embodiments will be described below in greater detail.

Referring back to FIG. 1, to populate the raw measurement data 115 into the environmental model 121 associated with the vehicle, the sensor fusion system 300 can spatially align the raw measurement data 115 to the environmental coordinate field of the environmental model 121. The sensor fusion system 300 also can identify when the sensors captured the raw measurement data 115, for example, by time stamping the raw measurement data 115 when received from the sensor system 110. The sensor fusion system 300 can populate the environmental model 121 with the time stamp or other time-of-capture information, which can be utilized to temporally align the raw measurement data 115 in the environmental model 121. In some embodiments, the sensor fusion system 300 can analyze the raw measurement data 115 from the multiple sensors as populated in the environmental model 121 to detect a sensor event or at least one object in the environmental coordinate field associated with the vehicle. The sensor event can include a sensor measurement event corresponding to a presence of the raw measurement data 115 in the environmental model 121, for example, above a noise threshold. The sensor event can include a sensor detection event corresponding to a spatial and/or temporal grouping of the raw measurement data 115 in the environmental model 121. The object can correspond to spatial grouping of the raw measurement data 115 having been tracked in the environmental model 121 over a period of time, allowing the sensor fusion system 300 to determine the raw measurement data 115 corresponds to an object around the vehicle. The sensor fusion system 300 can populate the environment model 121 with an indication of the detected sensor event or detected object and a confidence level of the detection. Embodiments of sensor fusion and sensor event detection or object detection will be described below in greater detail.

The sensor fusion system 300, in some embodiments, can generate feedback signals 116 to provide to the sensor system 110. The feedback signals 116 can be configured to prompt the sensor system 110 to calibrate one or more of its sensors. For example, the sensor system 110, in response to the feedback signals 116, can re-position at least one of its sensors, expand a field of view of at least one of its sensors, change a refresh rate or exposure time of at least one of its sensors, alter a mode of operation of at least one of its sensors, or the like.

The autonomous driving system 100 can include a driving functionality system 120 to receive at least a portion of the environmental model 121 from the sensor fusion system 300. The driving functionality system 120 can analyze the data included in the environmental model 121 to implement automated driving functionality or automated safety and assisted driving functionality for the vehicle. The driving functionality system 120 can generate control signals 131 based on the analysis of the environmental model 121.

The autonomous driving system 100 can include a vehicle control system 130 to receive the control signals 131 from the driving functionality system 120. The vehicle control system 130 can include mechanisms to control operation of the vehicle, for example by controlling different functions of the vehicle, such as braking, acceleration, steering, parking brake, transmission, user interfaces, warning systems, or the like, in response to the control signals.

Figure 3:
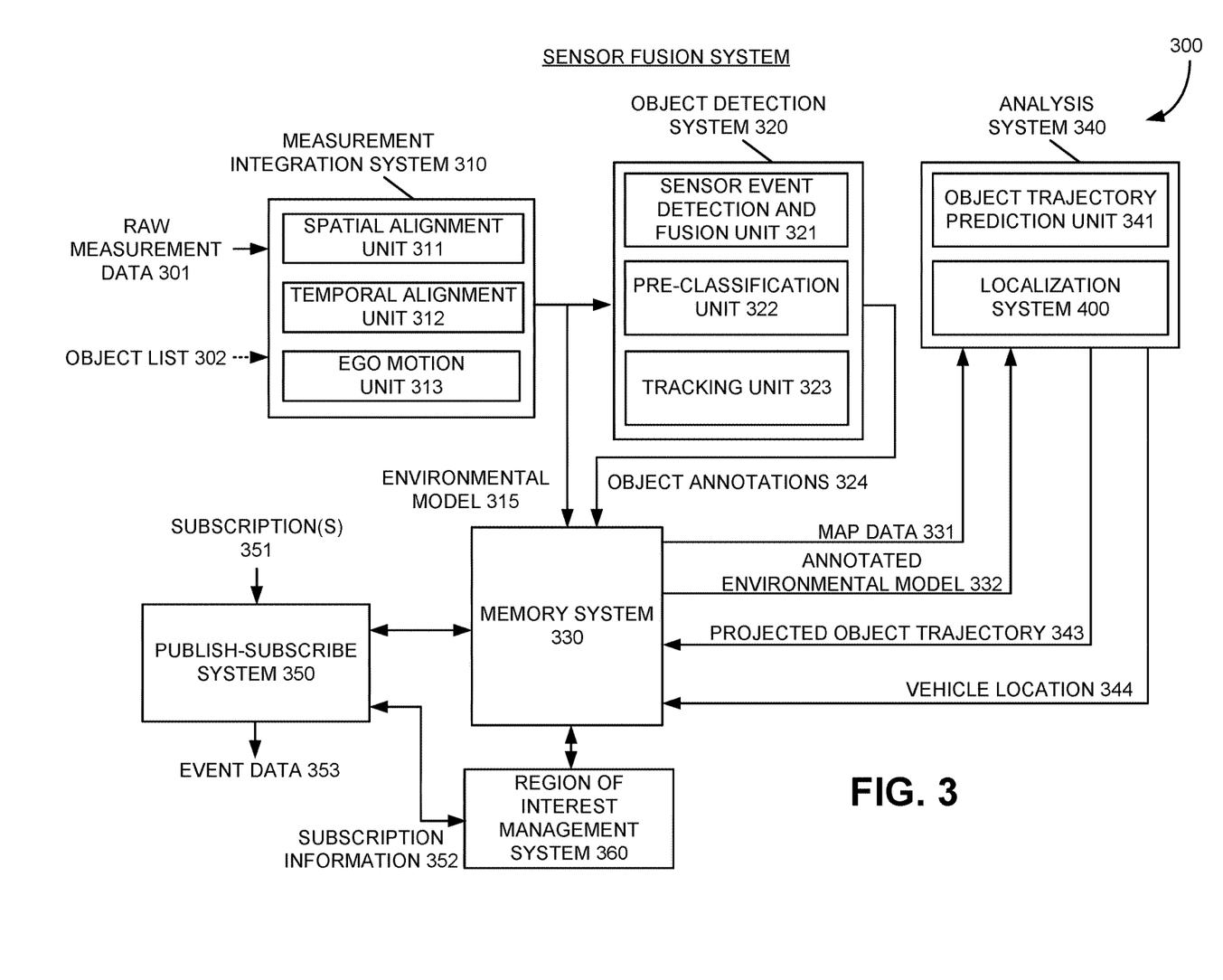
FIG. 3 illustrates an example sensor fusion system according to various examples of the invention.

FIG. 3 illustrates an example sensor fusion system 300 according to various examples. Referring to FIG. 3, the sensor fusion system 300 can include a measurement integration system 310 to receive raw measurement data 301 from multiple sensors mounted in a vehicle. The measurement integration system 310 can generate an environmental model 315 for the vehicle, which can be populated with the raw measurement data 301.

The measurement integration system 310 can include a spatial alignment unit 311 to correlate measurement coordinate fields of the sensors to an environmental coordinate field for the environmental model 315. The measurement integration system 310 can utilize this correlation to convert or translate locations for the raw measurement data 301 within the measurement coordinate fields into locations within the environmental coordinate field. The measurement integration system 310 can populate the environmental model 315 with the raw measurement data 301 based on the correlation between the measurement coordinate fields of the sensors to the environmental coordinate field for the environmental model 315.

The measurement integration system 310 also can temporally align the raw measurement data 301 from different sensors in the sensor system. In some embodiments, the measurement integration system 310 can include a temporal alignment unit 312 to assign time stamps to the raw measurement data 301 based on when the sensor captured the raw measurement data 301, when the raw measurement data 301 was received by the measurement integration system 310, or the like. In some embodiments, the temporal alignment unit 312 can convert a capture time of the raw measurement data 301 provided by the sensors into a time corresponding to the sensor fusion system 300. The measurement integration system 310 can annotate the raw measurement data 301 populated in the environmental model 315 with the time stamps for the raw measurement data 301. The time stamps for the raw measurement data 301 can be utilized by the sensor fusion system 300 to group the raw measurement data 301 in the environmental model 315 into different time periods or time slices. In some embodiments, a size or duration of the time periods or time slices can be based, at least in part, on a refresh rate of one or more sensors in the sensor system. For example, the sensor fusion system 300 can set a time slice to correspond to the sensor with a fastest rate of providing new raw measurement data 301 to the sensor fusion system 300.

The measurement integration system 310 can include an ego motion unit 313 to compensate for movement of at least one sensor capturing the raw measurement data 301, for example, due to the vehicle driving or moving in the environment. The ego motion unit 313 can estimate motion of the sensor capturing the raw measurement data 301, for example, by utilizing tracking functionality to analyze vehicle motion information, such as global positioning system (GPS) data, inertial measurements, vehicle odometer data, video images, or the like. The tracking functionality can implement a Kalman filter, a Particle filter, optical flow-based estimator, or the like, to track motion of the vehicle and its corresponding sensors relative to the environment surrounding the vehicle.

The ego motion unit 313 can utilize the estimated motion of the sensor to modify the correlation between the measurement coordinate field of the sensor to the environmental coordinate field for the environmental model 315. This compensation of the correlation can allow the measurement integration system 310 to populate the environmental model 315 with the raw measurement data 301 at locations of the environmental coordinate field where the raw measurement data 301 was captured as opposed to the current location of the sensor at the end of its measurement capture.

In some embodiments, the measurement integration system 310 may receive objects or object lists 302 from a variety of sources. The measurement integration system 310 can receive the object list 302 from sources external to the vehicle, such as in a vehicle-to-vehicle (V2V) communication, a vehicle-to-infrastructure (V2I) communication, a vehicle-to-pedestrian (V2P) communication, a vehicle-to-device (V2D) communication, a vehicle-to-grid (V2G) communication, or generally a vehicle-to-everything (V2X) communication. The measurement integration system 310 also can receive the objects or an object list 302 from other systems internal to the vehicle, such as from a human machine interface, mapping systems, localization system, driving functionality system, vehicle control system, or the vehicle may be equipped with at least one sensor that outputs the object list 302 rather than the raw measurement data 301.

The measurement integration system 310 can receive the object list 302 and populate one or more objects from the object list 302 into the environmental model 315 along with the raw measurement data 301. The object list 302 may include one or more objects, a time stamp for each object, and optionally include a spatial metadata associated with a location of objects in the object list 302. For example, the object list 302 can include speed measurements for the vehicle, which may not include a spatial component to be stored in the object list 302 as the spatial metadata. When the object list 302 includes a confidence level associated with an object in the object list 302, the measurement integration system 310 also can annotate the environmental model 315 with the confidence level for the object from the object list 302.

The sensor fusion system 300 can include an object detection system 320 to receive the environmental model 315 from the measurement integration system 310. In some embodiments, the sensor fusion system 300 can include a memory system 330 to store the environmental model 315 from the measurement integration system 310. The object detection system 320 may access the environmental model 315 from the memory system 330.

The object detection system 320 can analyze data stored in the environmental model 315 to detect a sensor detection event or at least one object. The sensor fusion system 300 can populate the environment model 315 with an indication of the sensor detection event or detected object at a location in the environmental coordinate field corresponding to the detection. The sensor fusion system 300 also can identify a confidence level associated with the detection, which can be based on at least one of a quantity, a quality, or a sensor diversity of raw measurement data 301 utilized in detecting the sensor detection event or detected object. The sensor fusion system 300 can populate the environment model 315 with the confidence level associated with the detection. For example, the object detection system 320 can annotate the environmental model 315 with object annotations 324, which populates the environmental model 315 with the detected sensor detection event or detected object and corresponding confidence level of the detection.

The object detection system 320 can include a sensor event detection and fusion unit 321 to monitor the environmental model 315 to detect sensor measurement events. The sensor measurement events can identify locations in the environmental model 315 having been populated with the raw measurement data 301 for a sensor, for example, above a threshold corresponding to noise in the environment. In some embodiments, the sensor event detection and fusion unit 321 can detect the sensor measurement events by identifying changes in intensity within the raw measurement data 301 over time, changes in reflections within the raw measurement data 301 over time, change in pixel values, or the like.

The sensor event detection and fusion unit 321 can analyze the raw measurement data 301 in the environmental model 315 at the locations associated with the sensor measurement events to detect one or more sensor detection events. In some embodiments, the sensor event detection and fusion unit 321 can identify a sensor detection event when the raw measurement data 301 associated with a single sensor. For example, the sensor event detection and fusion unit 321 can analyze an image captured by a camera in the raw measurement data 301 to identify edges in the image, shapes in the image, or the like, which the sensor event detection and fusion unit 321 can utilize to identify a sensor detection event for the image. The sensor event detection and fusion unit 321 also may analyze groups of intensity points in raw measurement data 301 corresponding to a lidar sensor or groups reflections in raw measurement data 301 corresponding to a radar sensor to determine the a sensor detection event for raw measurement data 301 for those sensors.

The sensor event detection and fusion unit 321, in some embodiments, can combine the identified sensor detection event for a single sensor with raw measurement data 301 associated with one or more sensor measurement events or sensor detection events captured by at least another sensor to generate a fused sensor detection event. The fused sensor detection event can correspond to raw measurement data 301 from multiple sensors, at least one of which corresponding to the sensor detection event identified by the sensor event detection and fusion unit 321.

The object detection system 320 can include a pre-classification unit 322 to assign a pre-classification to the sensor detection event or the fused sensor detection event. In some embodiments, the pre-classification can correspond to a type of object, such as another vehicle, a pedestrian, a cyclist, an animal, a static object, or the like. The pre-classification unit 322 can annotate the environmental model 315 with the sensor detection event, the fused sensor detection event and/or the assigned pre-classification.

The object detection system 320 can include a tracking unit 323 to track the sensor detection events or the fused sensor detection events in the environmental model 315 over time, for example, by analyzing the annotations in the environmental model 315, and determine whether the sensor detection event or the fused sensor detection event corresponds to an object in the environmental coordinate system. In some embodiments, the tracking unit 323 can track the sensor detection event or the fused sensor detection event utilizing at least one state change prediction model, such as a kinetic model, a probabilistic model, or other state change prediction model. The tracking unit 323 can select the state change prediction model to utilize to track the sensor detection event or the fused sensor detection event based on the assigned pre-classification of the sensor detection event or the fused sensor detection event by the pre-classification unit 322. The state change prediction model may allow the tracking unit 323 to implement a state transition prediction, which can assume or predict future states of the sensor detection event or the fused sensor detection event, for example, based on a location of the sensor detection event or the fused sensor detection event in the environmental model 315, a prior movement of the sensor detection event or the fused sensor detection event, a classification of the sensor detection event or the fused sensor detection event, or the like. In some embodiments, the tracking unit 323 implementing the kinetic model can utilize kinetic equations for velocity, acceleration, momentum, or the like, to assume or predict the future states of the sensor detection event or the fused sensor detection event based, at least in part, on its prior states. The tracking unit 323 may determine a difference between the predicted future state of the sensor detection event or the fused sensor detection event and its actual future state, which the tracking unit 323 may utilize to determine whether the sensor detection event or the fused sensor detection event is an object. After the sensor detection event or the fused sensor detection event has been identified by the pre-classification unit 322, the tracking unit 323 can track the sensor detection event or the fused sensor detection event in the environmental coordinate field associated with the environmental model 315, for example, across multiple different sensors and their corresponding measurement coordinate fields.

When the tracking unit 323, based on the tracking of the sensor detection event or the fused sensor detection event with the state change prediction model, determines the sensor detection event or the fused sensor detection event is an object, the object tracking unit 323 can annotate the environmental model 315 to indicate the presence of the object. The tracking unit 323 can continue tracking the detected object over time by implementing the state change prediction model for the object and analyzing the environmental model 315 when updated with additional raw measurement data 301. After the object has been detected, the tracking unit 323 can track the object in the environmental coordinate field associated with the environmental model 315, for example, across multiple different sensors and their corresponding measurement coordinate fields.

The sensor fusion system 300 can include an analysis system 340 to develop information from the environmental model 315 for utilization by automated driving functionality in a vehicle control system. The analysis system 340 can include an object trajectory prediction unit 341 to generate a projected object trajectory 343 of a tracked object proximate to the vehicle. The object trajectory prediction unit 341 can access the annotated environmental model 332 from the memory system 330 or receive them directly from the measurement integration system 310 and/or the object detection system 320. The object trajectory prediction unit 341 can utilize the annotated environmental model 332 along with the state change prediction model corresponding to the tracked object to predict movement of the tracked object relative to the vehicle in the future. Since a tracked object may have a multitude of options for moving in the future, in some embodiments, the object trajectory prediction unit 341 can generate a range of expected trajectories along with probabilities associated with the expected trajectories in the range. The object trajectory prediction unit 341 can annotate the environmental model 315 with the projected object trajectory 343, for example, by storing the projected object trajectory 343 in the annotated environmental model 332 residing in the memory system 330.

The analysis system 340 can include a localization system 400 to utilize the annotated environmental model 332 to determine a location of the vehicle. The localization system 400 can receive the global positioning system (GPS) information and map data 331, for example, from the memory system 330. The map data 331 can include topographical maps, terrain maps, street view maps, or the like, of an area corresponding to a location of the vehicle. The map data 331 can include features, such as roadways, signs, traffic signals, transit crossings, pedestrian crossings, buildings, trees, structures, terrain gradients, topographical edges, photogrammetry, intensity gradients, or the like.

The localization system 400 can correlate data or annotations in the annotated environmental model 332 to landmarks or objects in the map data 331. In some embodiments, the localization system 400 can access the annotated environmental model 332 from the memory system 330 or receive them directly from the measurement integration system 310 and/or the object detection system 320. The correlation between the map data 331 and the annotated environmental model 332 can identify a vehicle location 344 describing a position of the vehicle relative to the map data 331. The localization system 400 also can utilize the annotated environmental model 332 to determine in-lane localization for the vehicle. The in-lane localization can identify the vehicle location 344 describing the position of the vehicle relative to a lane in a roadway. The localization system 400 can selectively perform in-lane localization and map data correlation with the annotated environmental model 332 to identify the vehicle location 344, for example, based on a driving situation, processing resource utilization, or the like. The localization system 400 can output the vehicle location 344, which, in some embodiments, can be stored by the memory system 330 as another annotation to the annotated environmental model 332. Embodiments of vehicle localization will be described in FIGS. 4 and 5 in greater detail.

Localization

Figure 4:
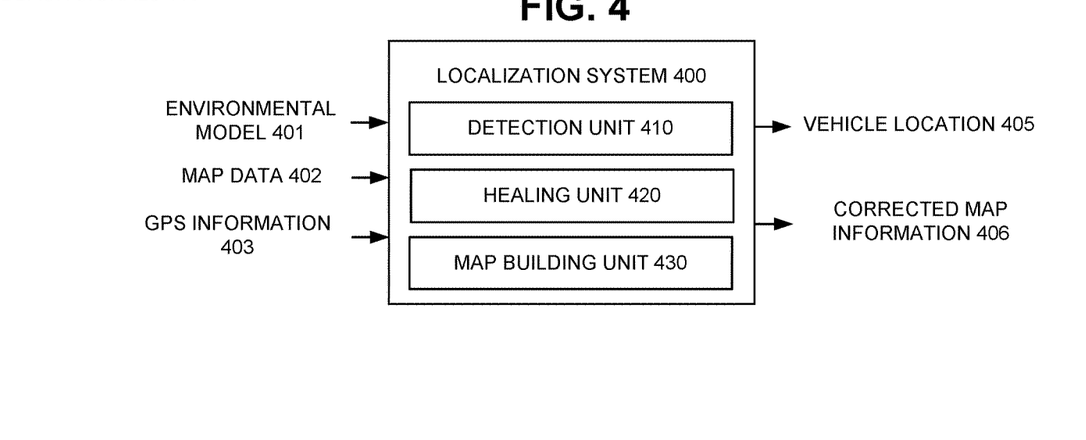
FIG. 4 illustrates an example localization system according to various examples of the invention.

FIG. 4 illustrates an example localization system 400 according to various examples of the invention. Referring to FIG. 4, the localization system 400 can receive an environmental model 401 and map data 402, for example, from a memory system 330. The environmental model 401 can include raw measurement data captured by a sensor system and optionally include annotations of detected events, tracked events, tracked objects, or the like. The map data 402 can include topographical maps, terrain maps, street view maps, or the like, of an area corresponding to a location of the vehicle. The map data 402 can include features, such as roadways, signs, traffic signals, transit crossings, pedestrian crossings, buildings, trees, structures, terrain gradients, topographical edges, photogrammetry, intensity gradients, or like. In some embodiments, the map data 402 can include one or more high-definition maps and one or more sparse maps. The sparse maps can include a subset of the data in the high-definition maps, for example, including landmarks or other invariant objects.

The localization system 400 can include a detection unit 410 to perform in-lane localization from data in the environmental model 401, which can detect a location of the vehicle relative to a lane on a roadway. The detection unit 410 also can detect when the environmental model 401 correlates to the map data 402. In some embodiments, the detection unit 410 can compare data in the environmental model 401 to data in the map data 402 and determine the environmental model 401 correlates to the map data 402 based on matches between data in the environmental model 401 and the map data 402. For example, the localization system 400 can determine a correlation between the environmental model 401 and the map data 402 after a predetermined number or percentage of matches, or when the matches correspond to invariant landmarks or objects in the map data 402.

In some embodiments, the localization system 400 can receive global positioning system (GPS) information 403, which can provide the localization system 400 a global reference to a location of the vehicle in the map data 402. The localization system 400 can utilize the GPS information 403 to identify a portion of the map data 402 to utilize to attempt to correlate with data in the environmental model 401.

The detection unit 410 can utilize the detection of the environmental model 401 correlating to the map data 402 or the in-lane localization to determine a vehicle location 405. In some embodiments, the detection unit 410 can transform an environmental coordinate field of the environmental model 401 to a global coordinate field associated with the map data 402 based on the vehicle location 405. The detection unit 410 can store the vehicle location 405 and/or transformed coordinates in the environmental model 401, for example, as stored in the memory system.

The localization system 400 also can evaluate detected correlations between the environmental model 401 and the map data 402 to identify which landmarks or objects within the map data 402 where invariant to change over time or in different driving conditions, such as weather, traffic congestions, lighting, or the like. In some embodiments, the localization system 400 can identify these landmarks or objects based on whether the landmarks or objects are static in the map data 402, have shapes or profiles allowing for sensor measurement, made of materials allowing for sensor measurement, located to allow unobstructed view by the sensor system, or the like.

The localization system 400, in some embodiments, may switch between utilizing sparse maps and high definition maps to detect correlation between the environmental model 401 and the map data 402 based on the evaluation. For example, when the localization system 400 determines the current vehicle location should include one or more of these identified invariant landmarks or objects, the localization system 400 may elect to switch to utilizing a sparse map to detect a correlation between the invariant landmarks or objects in the sparse map and data in the environmental model 401. By reducing a quantity of map data for the localization system 400 to analyze for correlation with the environmental model 401, the localization system 400 can reduce utilization of processing resources and associated latency.

When the detection unit 410 is unable to correlate the environmental model 401 to the map data 402, the localization system 400 can enter into a healing mode of operation. The localization system 400 can include a healing unit 420 to determine the vehicle location 405 in the healing mode, while the detection unit 410 continues attempting to correlate the environmental model 401 to the map data 402.

The healing unit 420 can track the movement of the vehicle and roughly correlate the tracked movement to the map data 402, for example, based on its last known correlated location. The healing unit 420 can track the movement of the vehicle based, at least in part, on vehicle movement measurements, such as inertial measurements, vehicle odometer data, video images, or the like, some of which may be included in the environmental model 401. Without an external reference, such as a map data correlation or GPS information 403, the internally tracked vehicle motion can experience drift, where the internally tracked vehicle motion becomes misaligned to the map data 402.

The healing unit 420 can analyze the environmental model 401 to perform in-lane localization of the vehicle, for example, to determine the vehicle location 405 relative to traffic lines or lanes on a roadway. In some embodiments, the healing unit 420 can utilize sensor data corresponding to lines on the roads, raised edges of sidewalks, adjacent vehicles or the like, to determine where within a lane the vehicle resides. The healing unit 420 also can prompt an increased precision in the data within the environmental model 401, for example, by directing the vehicle to reduce speed and/or the sensor system to increase sensor refresh rate, increase captured data precision, or the like.

In some embodiments, the healing unit 420, while in the healing mode, may determine portions of the map data 402 may be incomplete or missing. In some embodiments, the healing unit 420 can flag these sections of the map data 402 as incomplete or missing, so a control system for the vehicle proceeds with caution in this area. The healing unit 420 may build map data by generating data corresponding to the incomplete or missing map data based, at least in part, on the vehicle movement tracking and the measurement data in the environmental model 401.

After the localization unit 400 reacquires an external reference, for example, correlates the environmental model 401 to the map data 402, the localization system 400 may populate the map data 402 with the vehicle movement tracking and/or data in the environmental model 401 for these missing or incomplete sections. The localization system 400 can store data collected during the vehicle movement tracking and/or corrected map data 406 to the memory system for subsequent utilization when traversing that area or to upload the generated map data to an external server for utilization by other vehicles.

The localization unit 400 can include a map building unit 430 to utilize data from the environmental model 401 to generate map data, for example, in an area where the localization system 400 has no access to map data or incomplete map data. During a map building phase, the vehicle may be set at a low speed and the sensors system set to capture measurements with a high-precision. The vehicle may move in this unmapped or under-mapped environment similarly as in the healing mode, for example, with in-lane localization, increased sensor data precision, and vehicle tracking. The map building unit 430 may exit a map build mode by directing the vehicle to move towards an area having map data. When the vehicle correlates data in the environmental model 401 to map data, the map building unit 430 experiences loop closure, and the localization system 400 can store newly-generated map data to the memory system for subsequent utilization when traversing that area or to upload the generated map data to an external server for utilization by other vehicles.

Figure 5:
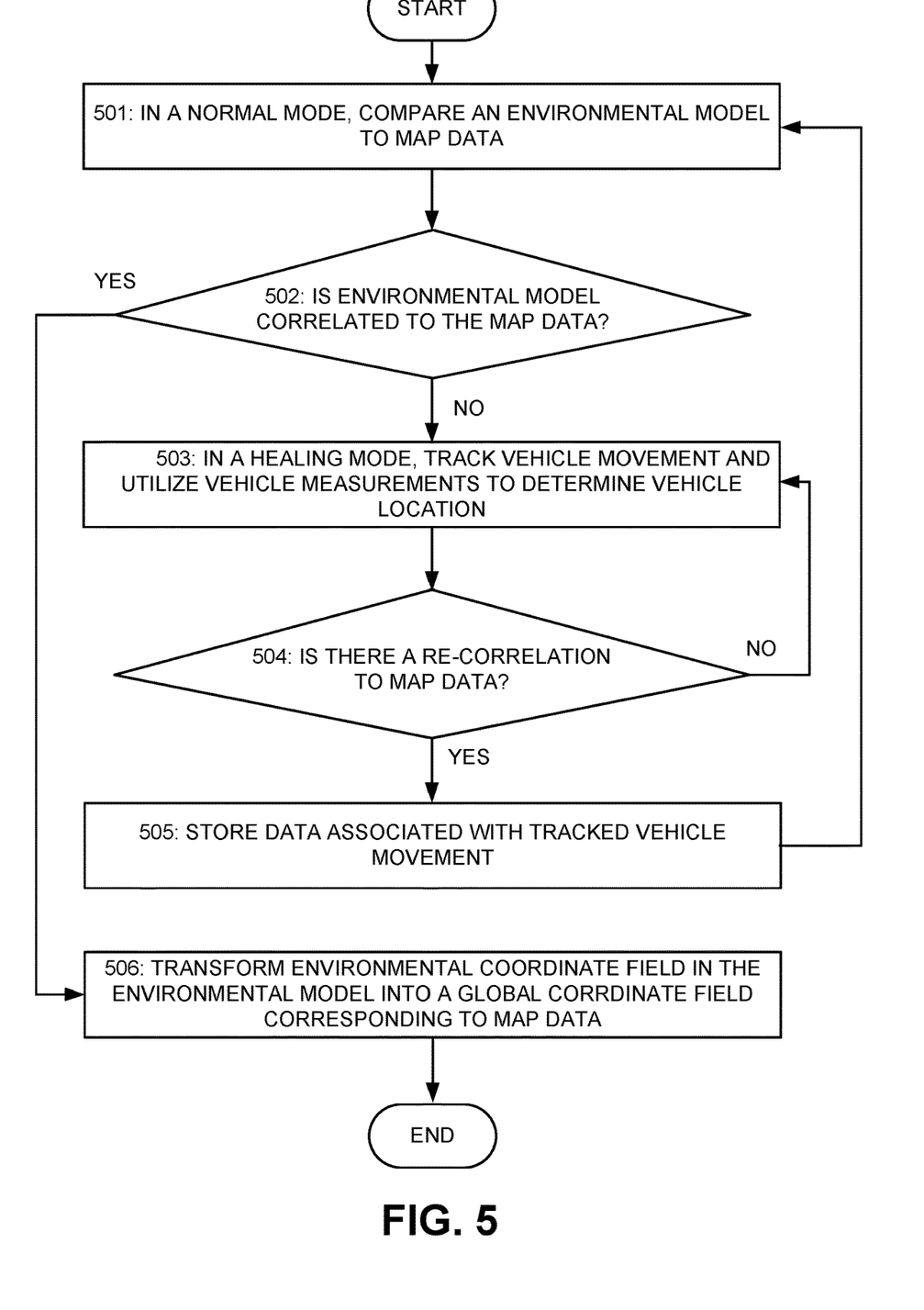
FIG. 5 illustrates an example flowchart for vehicle localization according to various examples of the invention.

FIG. 5 illustrates an example flowchart for vehicle localization according to various examples of the invention. Referring to FIG. 5, in a block 501, a localization system, in a normal mode, can compare data in an environmental model to map data. The localization system may utilize GPS information to determine which portion of the map data the localization system should compare with the environmental model. The map data can correspond to a detailed map or a sparsely populated map, for example, with a subset of the data in the detailed map. For example, the sparsely populated map may include data corresponding to landmarks or other invariant objects in the detailed map. The localization system can selectively utilize the detailed map and/or the sparsely populated map to compare with the data from the environmental model. The localization system, in the normal mode, also can utilize the environmental model to perform in-lane localization for the vehicle.

In a decision block 502, the localization system, in the normal mode, can determine whether the data in the environmental model correlates to the map data. For example, the localization system can determine a correlation between the environmental model and the map data after a predetermined number or percentage of matches, or when the matches correspond to invariant landmarks or objects in the map data.

When in the decision block 502, the data in the environmental model correlates to the map data, execution proceeds to block 506, where the localization system can transform an environmental coordinate field of the environmental model into a global coordinate field associated with the map data. In some embodiments, the localization system also can store the transformed coordinates in the memory system.

When in the decision block 502, the data in the environmental model does not correlate to the map data, execution proceeds to block 503, where the localization system can enter a healing mode. In the healing mode, the localization system can attempt to re-correlate the environmental model to the map data. The localization system also can track vehicle movement and roughly correlate the tracked movement to the map data, for example, based on its last known correlated location or a last known location with matched map data. The localization system can track the movement of the vehicle based, at least in part, on vehicle movement measurements, such as inertial measurements, vehicle odometer data, video images, or the like, some of which may be included in the environmental model.

Also, in the healing mode, the localization system can utilize vehicle measurements to determine vehicle location. The localization system can analyze the environmental model to perform in-lane localization of the vehicle, for example, to determine the vehicle location relative to traffic lines or lanes on a roadway. In some embodiments, the localization system can utilize sensor data corresponding to lines on the roads, raised edges of sidewalks, adjacent vehicles or the like, to determine where within a lane the vehicle resides.

In a decision block 504, the localization system, in the healing mode, can determine whether the environmental model has re-correlated to the map data. In some embodiments, the localization system can continue to compare the environmental model to map data over time. When the localization system determines a correlation between the environmental model and the map data or otherwise acquires the external reference, the localization system can align the internally-generated vehicle location and tracked vehicle movement to the global coordinate field.

When in the decision block 504, the localization system has re-correlated the environmental model to the map data, execution proceeds to block 505, where the localization system can store the data associated with the tracked vehicle movement as corrected map data. Execution can then return back to the block 501. When in the decision block 504, the localization system has re-correlated the environmental model to the map data, execution reverts back to the block 503, where the localization system can continue to track vehicle movement and utilize local measurements to determine vehicle location.

Referring back to FIG. 3, the sensor fusion system 300 can include a publish-subscribe system 350 to communicate with devices, components, or applications external to the sensor fusion system 300. In some embodiments, the publish-subscribe system 350 can allow processes or applications in a driving functionality system to receive information from the annotated environmental model 332 or to provide annotations to the annotated environmental model 332.

The publish-subscribe system 350 can receive subscriptions 351, for example, from a driving functionality system, a vehicle control system, or other devices external from the sensor fusion system 300. The subscriptions 351 may identify at least one region of interest in the annotated environmental model 332 for a region of interest management system 360 to monitor for data or events. The region of interest can have a spatially description, for example, a portion of the environmental coordinate field in the annotated environmental model 332. The region of interest can have a temporal description, for example, as time window or a time offset during which the region of interest management system 360 can monitor the annotated environmental model 332. In some embodiments, the subscriptions 351 can include additional monitoring information, such as a type of data to monitor, a type of detection, and whether to enable dynamic adaptation of the identified region of interest.

The publish-subscribe system 350 can provide at least a portion of the subscriptions 351 to the region of interest management system 360 as subscription information 352. The region of interest management system 360 can analyze the subscription information 352 to identify at least one region of interest of the annotated environmental model 332 to monitor for data or events. In some embodiments, the region of interest management system 360 can include a registry of the one or more regions of interest that the region of interest management system 360 monitors based on the subscription information 352 from the publish-subscribe system 350.

The region of interest management system 360 can monitor the environmental model 315, for example, by accessing the memory system 330, to identify data and events corresponding to at least one of the regions of interest in the registry. When the region of interest management system 360 detects data or an event corresponding to a region of interest in a subscription 352, the region of interest management system 360 can forward detection information to the publish-subscribe system 350. The detection information can identify the region of interest associated with the detection, the detected portion of the annotated environmental model 332, a reference to the detected portion of the annotated environmental model 332 in the memory system 330, a type of detection, or the like. The publish-subscribe system 350 can utilize the detection information to generate and output event data 353 to the devices, systems, applications, or components that provided the publish-subscribe system 350 the subscription 351 describing the region of interest associated with the detection.

The region of interest management system 360 also can dynamically adapt the region of interest for one or more of the subscriptions 351, for example, based on the mode of operation of the vehicle, a planned path or route the vehicle expects to traverse, features in map data 331, or the like. For example, the region of interest management system 360 or other portion of the sensor fusion system 300 can identify locations of upcoming traffic lights or signage and suggest the process or component in the driving functionality system expand its region of interest or add a new region of interest to include the upcoming traffic lights or signage. In another example, the region of interest management system 360 or other portion of the sensor fusion system 300 can identify the vehicle plans to make a turn and expand its region of interest to include areas corresponding to the road after making the turn.

Illustrative Operating Environment

The execution of various driving automation processes according to embodiments of the invention may be implemented using computer-executable software instructions executed by one or more programmable computing devices. Because these embodiments of the invention may be implemented using software instructions, the components and operation of a programmable computer system on which various embodiments of the invention may be employed will be described below.

Figure 6:
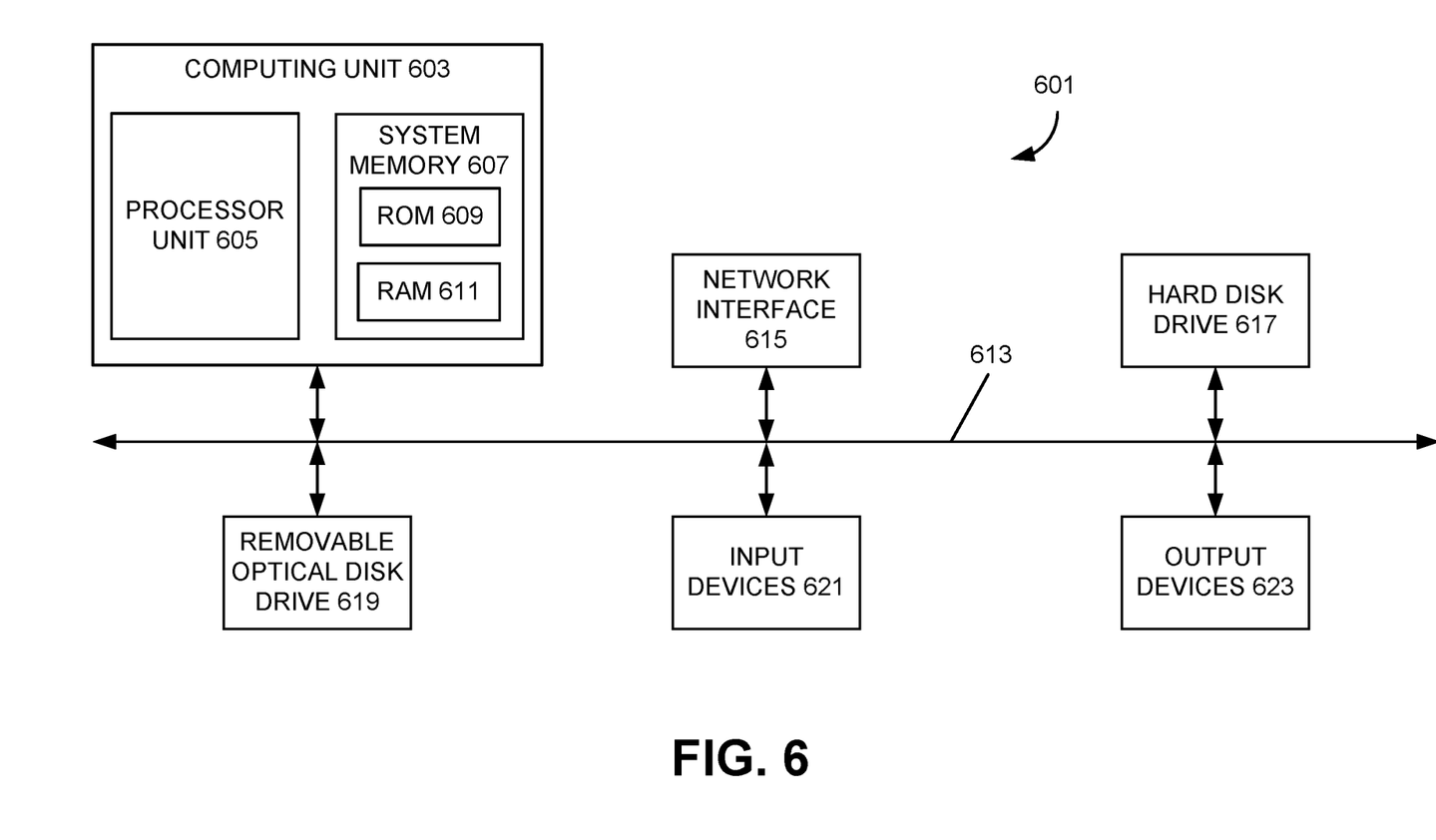
FIGS. 6 and 7 illustrate an example of a computer system of the type that may be used to implement various embodiments of the invention.
Figure 7:
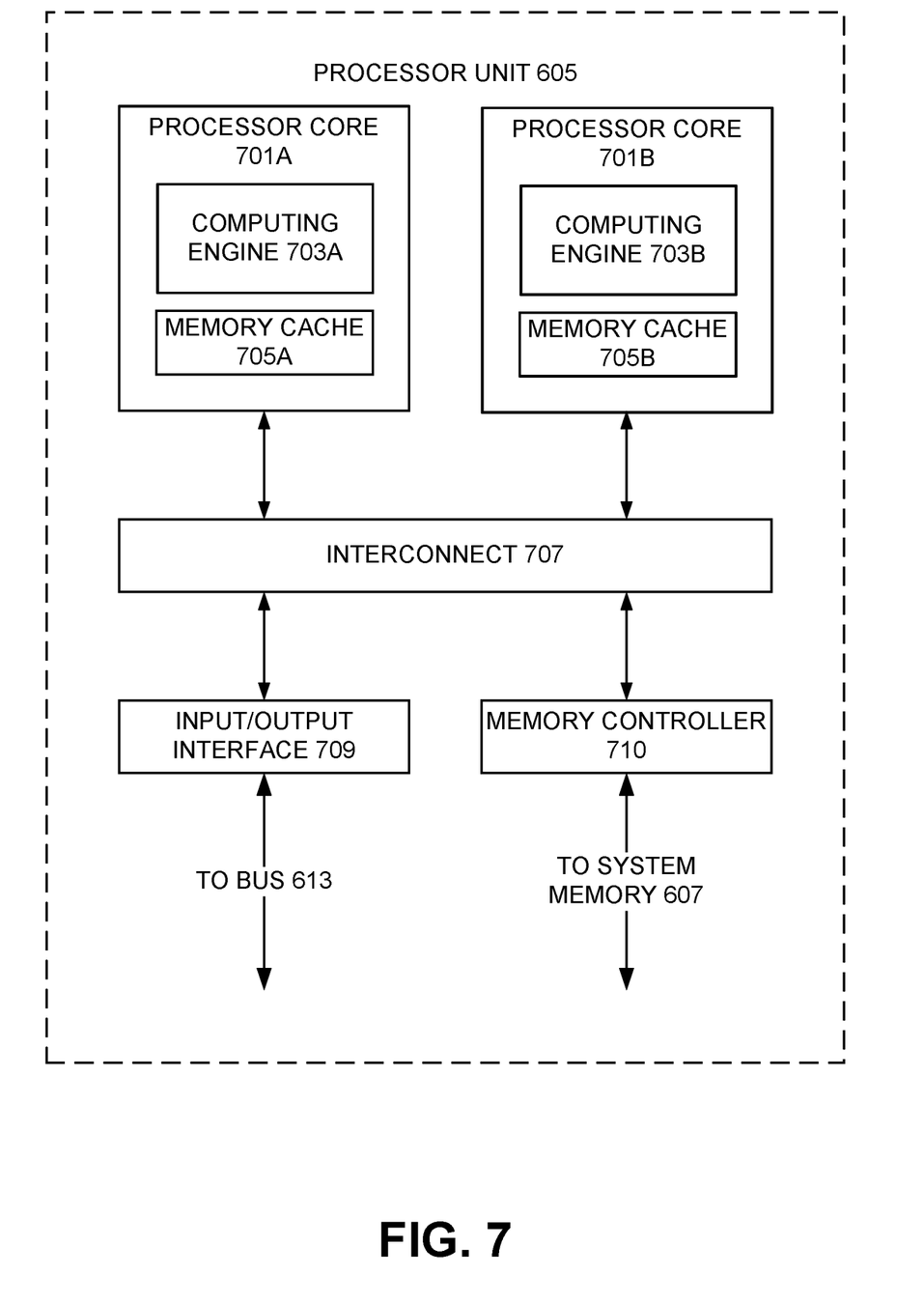

FIGS. 6 and 7 illustrate an example of a computer system of the type that may be used to implement various embodiments of the invention. Referring to FIG. 6, various examples of the invention may be implemented through the execution of software instructions by a computing device 601, such as a programmable computer. Accordingly, FIG. 6 shows an illustrative example of a computing device 601. As seen in FIG. 6, the computing device 601 includes a computing unit 603 with a processing unit 605 and a system memory 607. The processing unit 605 may be any type of programmable electronic device for executing software instructions, but will conventionally be a microprocessor. The system memory 607 may include both a read-only memory (ROM) 609 and a random access memory (RAM) 611. As will be appreciated by those of ordinary skill in the art, both the read-only memory (ROM) 609 and the random access memory (RAM) 611 may store software instructions for execution by the processing unit 605.

The processing unit 605 and the system memory 607 are connected, either directly or indirectly, through a bus 613 or alternate communication structure, to one or more peripheral devices 617-623. For example, the processing unit 605 or the system memory 607 may be directly or indirectly connected to one or more additional memory storage devices, such as a hard disk drive 617, which can be magnetic and/or removable, a removable optical disk drive 619, and/or a flash memory card. The processing unit 605 and the system memory 607 also may be directly or indirectly connected to one or more input devices 621 and one or more output devices 623. The input devices 621 may include, for example, a keyboard, a pointing device (such as a mouse, touchpad, stylus, trackball, or joystick), a scanner, a camera, and a microphone. The output devices 623 may include, for example, a monitor display, a printer and speakers. With various examples of the computing device 601, one or more of the peripheral devices 617-623 may be internally housed with the computing unit 603. Alternately, one or more of the peripheral devices 617-623 may be external to the housing for the computing unit 603 and connected to the bus 613 through, for example, a Universal Serial Bus (USB) connection.

With some implementations, the computing unit 603 may be directly or indirectly connected to a network interface 615 for communicating with other devices making up a network. The network interface 615 can translate data and control signals from the computing unit 603 into network messages according to one or more communication protocols, such as the transmission control protocol (TCP) and the Internet protocol (IP). Also, the network interface 615 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computing device 601 is illustrated as an example only, and it not intended to be limiting. Various embodiments of the invention may be implemented using one or more computing devices that include the components of the computing device 601 illustrated in FIG. 6, which include only a subset of the components illustrated in FIG. 6, or which include an alternate combination of components, including components that are not shown in FIG. 6. For example, various embodiments of the invention may be implemented using a multi-processor computer, a plurality of single and/or multiprocessor computers arranged into a network, or some combination of both.

With some implementations of the invention, the processor unit 605 can have more than one processor core. Accordingly, FIG. 7 illustrates an example of a multi-core processor unit 605 that may be employed with various embodiments of the invention. As seen in this figure, the processor unit 605 includes a plurality of processor cores 701A and 701B. Each processor core 701A and 701B includes a computing engine 703A and 703B, respectively, and a memory cache 705A and 705B, respectively. As known to those of ordinary skill in the art, a computing engine 703A and 703B can include logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 703A and 703B may then use its corresponding memory cache 705A and 705B, respectively, to quickly store and retrieve data and/or instructions for execution.

Each processor core 701A and 701B is connected to an interconnect 707. The particular construction of the interconnect 707 may vary depending upon the architecture of the processor unit 605. With some processor cores 701A and 701B, such as the Cell microprocessor created by Sony Corporation, Toshiba Corporation and IBM Corporation, the interconnect 707 may be implemented as an interconnect bus. With other processor units 701A and 701B, however, such as the Opteron™ and Athlon™ dual-core processors available from Advanced Micro Devices of Sunnyvale, Calif., the interconnect 707 may be implemented as a system request interface device. In any case, the processor cores 701A and 701B communicate through the interconnect 707 with an input/output interface 709 and a memory controller 710. The input/output interface 709 provides a communication interface between the processor unit 605 and the bus 613. Similarly, the memory controller 710 controls the exchange of information between the processor unit 605 and the system memory 607. With some implementations of the invention, the processor unit 605 may include additional components, such as a high-level cache memory accessible shared by the processor cores 701A and 701B. It also should be appreciated that the description of the computer network illustrated in FIG. 6 and FIG. 7 is provided as an example only, and it not intended to suggest any limitation as to the scope of use or functionality of alternate embodiments of the invention.

The system and apparatus described above may use dedicated processor systems, micro controllers, programmable logic devices, microprocessors, or any combination thereof, to perform some or all of the operations described herein. Some of the operations described above may be implemented in software and other operations may be implemented in hardware. Any of the operations, processes, and/or methods described herein may be performed by an apparatus, a device, and/or a system substantially similar to those as described herein and with reference to the illustrated figures.

The processing device may execute instructions or "code" stored in a computer-readable memory device. The memory device may store data as well. The processing device may include, but may not be limited to, an analog processor, a digital processor, a microprocessor, a multi-core processor, a processor array, a network processor, or the like. The processing device may be part of an integrated control system or system manager, or may be provided as a portable electronic device configured to interface with a networked system either locally or remotely via wireless transmission.

The processor memory may be integrated together with the processing device, for example RAM or FLASH memory disposed within an integrated circuit microprocessor or the like. In other examples, the memory device may comprise an independent device, such as an external disk drive, a storage array, a portable FLASH key fob, or the like. The memory and processing device may be operatively coupled together, or in communication with each other, for example by an I/O port, a network connection, or the like, and the processing device may read a file stored on the memory. Associated memory devices may be "read only" by design (ROM) by virtue of permission settings, or not. Other examples of memory devices may include, but may not be limited to, WORM, EPROM, EEPROM, FLASH, NVRAM, OTP, or the like, which may be implemented in solid state semiconductor devices. Other memory devices may comprise moving parts, such as a known rotating disk drive. All such memory devices may be "machine-readable" and may be readable by a processing device.

Operating instructions or commands may be implemented or embodied in tangible forms of stored computer software (also known as "computer program" or "code"). Programs, or code, may be stored in a digital memory device and may be read by the processing device. "Computer-readable storage medium" (or alternatively, "machine-readable storage medium") may include all of the foregoing types of computer-readable memory devices, as well as new technologies of the future, as long as the memory devices may be capable of storing digital information in the nature of a computer program or other data, at least temporarily, and as long at the stored information may be "read" by an appropriate processing device. The term "computer-readable" may not be limited to the historical usage of "computer" to imply a complete mainframe, mini-computer, desktop or even laptop computer. Rather, "computer-readable" may comprise storage medium that may be readable by a processor, a processing device, or any computing system. Such media may be any available media that may be locally and/or remotely accessible by a computer or a processor, and may include volatile and non-volatile media, and removable and non-removable media, or any combination thereof.

A program stored in a computer-readable storage medium may comprise a computer program product. For example, a storage medium may be used as a convenient means to store or transport a computer program. For the sake of convenience, the operations may be described as various interconnected or coupled functional blocks or diagrams. However, there may be cases where these functional blocks or diagrams may be equivalently aggregated into a single logic device, program or operation with unclear boundaries.

CONCLUSION

While the application describes specific examples of carrying out embodiments of the invention, those skilled in the art will appreciate that there are numerous variations and permutations of the above described systems and techniques that fall within the spirit and scope of the invention as set forth in the appended claims. For example, while specific terminology has been employed above to refer to electronic design automation processes, it should be appreciated that various examples of the invention may be implemented using any desired combination of electronic design automation processes.

One of skill in the art will also recognize that the concepts taught herein can be tailored to a particular application in many other ways. In particular, those skilled in the art will recognize that the illustrated examples are but one of many alternative implementations that will become apparent upon reading this disclosure.

Although the specification may refer to "an", "one", "another", or "some" example(s) in several locations, this does not necessarily mean that each such reference is to the same example(s), or that the feature only applies to a single example.

The invention claimed is:

1. A method comprising:
   when a vehicle is without an external reference to a global coordinate field, comparing, by a computing system, map data having the global coordinate field to at least a portion of an environmental model having an environmental coordinate field populated with measurement data captured by sensors mounted in the vehicle, wherein the measurement data is temporally aligned and spatially aligned in the environmental model;
   when the comparison does not identify a correlation between the measurement data in the environmental model and the map data, tracking, by the computing system, movement of the vehicle based, at least in part, on subsequent measurement data in the environmental model;
   detecting, by the computing system, a location of the vehicle relative to the map data based on a subsequent comparison of the map data to the subsequent measurement data in the environmental model; and
   when the subsequent comparison identifies a correlation between the subsequent measurement data in the environmental model and the map data, aligning, by the computing system, the tracked movement of the vehicle and the subsequent measurement data to the map data based, at least in part, on the detected location of the vehicle relative to the map data.

2. The method of claim 1, further comprising when the comparison identifies the correlation between the measurement data in the environmental model and the map data, detecting, by the computing system, landmarks in the map data based, at least in part, on the correlation between the measurement data in the environmental model and the map data.

3. The method of claim 2, wherein the detected landmarks in the map data correspond to static objects having characteristics conducive to being measured by one or more of the sensors.

4. The method of claim 2, further comprising switching, by the computing system, to sparsely-populated map data from higher-definition map data for subsequent comparisons with the environmental model based on the detection of the landmarks.

5. The method of claim 1, further comprising associating, by the computing system, the tracked movement of the vehicle and the subsequent measurement data to the map data based, at least in part, on a previously detected location of the vehicle relative to the map data.

6. The method of claim 1, further comprising modifying, by the computing system, the map data to include the subsequent measurement data utilized to track the movement of the vehicle.

7. An apparatus comprising at least one memory device storing instructions configured to cause one or more processing devices to perform operations comprising:
   when a vehicle is without an external reference to a global coordinate field, comparing map data having the global coordinate field to at least a portion of an environmental model having an environmental coordinate field populated with measurement data captured by sensors mounted in the vehicle, wherein the measurement data is temporally aligned and spatially aligned in the environmental model;
   when the comparison does not identify a correlation between the measurement data in the environmental model and the map data, tracking movement of the vehicle based, at least in part, on subsequent measurement data in the environmental model;
   detecting a location of the vehicle relative to the map data based on a subsequent comparison of the map data to the subsequent measurement data in the environmental model; and
   when the subsequent comparison identifies a correlation between the subsequent measurement data in the environmental model and the map data, aligning the tracked movement of the vehicle and the subsequent measurement data to the map data based, at least in part, on the detected location of the vehicle relative to the map data.

8. The apparatus of claim 7, wherein the instructions are further configured to cause the one or more processing devices to perform operations comprising modifying the map data to include the subsequent measurement data utilized to track the movement of the vehicle.

9. The apparatus of claim 7, wherein the instructions are further configured to cause the one or more processing devices to perform operations comprising, when the comparison identifies the correlation between the measurement data in the environmental model and the map data, detecting landmarks in the map data based, at least in part, on the correlation between the measurement data in the environmental model and the map data.

10. The apparatus of claim 9, wherein the detected landmarks in the map data correspond to static objects having characteristics conducive to being measured by one or more of the sensors.

11. The apparatus of claim 9, wherein the instructions are further configured to cause the one or more processing devices to perform operations comprising switching to sparsely-populated map data from higher-definition map data for subsequent comparisons with the environmental model based on the detection of the landmarks.

12. The apparatus of claim 7, wherein the instructions are further configured to cause the one or more processing devices to perform operations comprising associating the tracked movement of the vehicle and the subsequent measurement data to the map data based, at least in part, on a previously detected location of the vehicle relative to the map data.

13. A system comprising:
a memory device configured to store machine-readable instructions; and
a computing system including one or more processing devices, in response to executing the machine-readable instructions, configured to:
when a vehicle is without an external reference to a global coordinate field, compare map data having the global coordinate field to at least a portion of an environmental model having an environmental coordinate field populated with measurement data captured by sensors mounted in the vehicle, wherein the measurement data is temporally aligned and spatially aligned in the environmental model;
when the comparison does not identify a correlation between the measurement data in the environmental model and the map data, track movement of the vehicle based, at least in part, on subsequent measurement data in the environmental model;
detect a location of the vehicle relative to the map data based on a subsequent comparison of the map data to the subsequent measurement data in the environmental model; and
when the subsequent comparison identifies a correlation between the subsequent measurement data in the environmental model and the map data, align the tracked movement of the vehicle and the subsequent measurement data to the map data based, at least in part, on the detected location of the vehicle relative to the map data.

14. The system of claim 13, wherein the one or more processing devices, in response to executing the machine-readable instructions, are configured to associate the tracked movement of the vehicle and the subsequent measurement data to the map data based, at least in part, on a previously detected location of the vehicle relative to the map data.

15. The system of claim 13, wherein the one or more processing devices, in response to executing the machine-readable instructions, are configured to modify the map data to include the subsequent measurement data utilized to track the movement of the vehicle.

16. The system of claim 13, wherein the one or more processing devices, in response to executing the machine-readable instructions, are configured to, when the comparison identifies the correlation between the measurement data in the environmental model and the map data, detect landmarks in the map data based, at least in part, on the correlation between the measurement data in the environmental model and the map data, wherein the detected landmarks in the map data correspond to static objects having characteristics conducive to being measured by one or more of the sensors.

17. The system of claim 16, wherein the one or more processing devices, in response to executing the machine-readable instructions, are configured to switch to sparsely-populated map data from higher-definition map data for subsequent comparisons with the environmental model based on the detection of the landmarks.

* * * * *